United States Patent
Engl

(10) Patent No.: US 9,865,973 B2
(45) Date of Patent: Jan. 9, 2018

(54) PLUGGABLE ELECTRICAL CONNECTOR

(71) Applicant: MD ELEKTRONIK GmbH, Waldkraiburg (DE)

(72) Inventor: Rudolf Engl, Ampfing (DE)

(73) Assignee: MD ELEKTRONIK GMBH, Waldkraiburg (DE)

( * ) Notice: Subject to any disclaimer, the term of this patent is extended or adjusted under 35 U.S.C. 154(b) by 0 days.

(21) Appl. No.: 15/484,151

(22) Filed: Apr. 11, 2017

(65) Prior Publication Data

US 2017/0294748 A1   Oct. 12, 2017

(30) Foreign Application Priority Data

Apr. 12, 2016 (EP) .................................. 16164804

(51) Int. Cl.

| | | |
|---|---|---|
| *H01R 12/00* | (2006.01) | |
| *H01R 24/60* | (2011.01) | |
| *H05K 1/18* | (2006.01) | |
| *H01R 13/66* | (2006.01) | |
| *H01R 12/71* | (2011.01) | |
| *H01R 13/504* | (2006.01) | |
| *H01R 107/00* | (2006.01) | |

(52) U.S. Cl.
CPC ............ *H01R 24/60* (2013.01); *H01R 12/716* (2013.01); *H01R 13/504* (2013.01); *H01R 13/665* (2013.01); *H05K 1/181* (2013.01); *H01R 2107/00* (2013.01)

(58) Field of Classification Search
CPC .............. H01R 2107/00; H01R 13/665; H01R 13/504; H01R 12/716; H01R 24/60; H05K 1/181

USPC ........ 439/676, 76.1, 946; 361/818, 752, 737
See application file for complete search history.

(56) References Cited

U.S. PATENT DOCUMENTS

| | | | | |
|---|---|---|---|---|
| 3,668,476 A | * | 6/1972 | Wrabel | ................ H05K 7/1427 361/740 |
| 5,797,771 A | | 8/1998 | Garside | |
| 6,190,206 B1 | * | 2/2001 | Yang | ................ H01R 13/6585 439/456 |
| 6,241,534 B1 | * | 6/2001 | Neer | ...................... H01R 31/06 439/76.1 |
| 6,312,264 B1 | * | 11/2001 | Franz | ..................... H05K 1/119 439/76.1 |
| 7,448,914 B2 | * | 11/2008 | Calvas | ................. G06K 7/0021 439/638 |

(Continued)

FOREIGN PATENT DOCUMENTS

| | | |
|---|---|---|
| DE | 202004012318 U1 | 12/2005 |
| DE | 102007048159 A1 | 4/2009 |
| WO | WO 9407284 A1 | 3/1994 |

*Primary Examiner* — Abdullah Riyami
*Assistant Examiner* — Nelson R Burgos-Guntin
(74) *Attorney, Agent, or Firm* — Leydig, Voit & Mayer, Ltd.

(57) ABSTRACT

A pluggable electrical connector includes a thermally conductive housing having an opening and a circuit board having electronic components, at least one plug contact and at least one joining surface. The circuit board is surrounded by the housing. A joining seam connects the housing and the circuit board to each other. The joining seam is located between the at least one joining surface and the housing and is produced on an exterior side of the pluggable connector such that the opening is at least partially closed by the joining seam.

15 Claims, 4 Drawing Sheets

(56) References Cited

U.S. PATENT DOCUMENTS

| | | | | |
|---|---|---|---|---|
| 7,517,231 B2* | 4/2009 | Hiew | H05K 9/0067 | 439/76.1 |
| 7,530,818 B1* | 5/2009 | Wang | H01R 31/065 | 439/638 |
| 7,896,702 B2* | 3/2011 | Stiehl | H01R 13/6658 | 439/620.22 |
| 8,053,685 B2* | 11/2011 | Watanabe | H05K 1/111 | 174/260 |
| 8,096,837 B2* | 1/2012 | Kan | H01R 13/501 | 439/638 |
| 8,199,527 B2* | 6/2012 | Muranaga | H01L 23/053 | 174/350 |
| 8,282,424 B2* | 10/2012 | Weinmann | H01R 13/6658 | 439/676 |
| 8,337,250 B1* | 12/2012 | Yang | H01R 13/112 | 439/620.22 |
| 8,525,024 B2* | 9/2013 | Kaneda | F16J 15/064 | 174/386 |
| 8,911,262 B1* | 12/2014 | Leiba | H01R 24/60 | 439/660 |
| 9,006,581 B2* | 4/2015 | Kawaguchi | H05K 1/0218 | 174/250 |
| 2005/0070162 A1* | 3/2005 | Espenshade | H01R 13/65802 | 439/620.11 |
| 2005/0136747 A1* | 6/2005 | Caveney | H05K 1/0228 | 439/676 |
| 2006/0028803 A1* | 2/2006 | Pocrass | G06K 19/077 | 361/737 |
| 2007/0167054 A1* | 7/2007 | Wu | F21V 23/06 | 439/238 |
| 2007/0298643 A1* | 12/2007 | Nishimatsu | H01R 12/88 | 439/278 |
| 2007/0298663 A1* | 12/2007 | Marshall | B29C 35/0272 | 439/620.22 |
| 2008/0002372 A1* | 1/2008 | Kelso | G06K 19/07309 | 361/737 |
| 2008/0003884 A1* | 1/2008 | Spengler | H05K 1/0268 | 439/620.22 |
| 2008/0007934 A1* | 1/2008 | Liu | H01L 23/3114 | 361/818 |
| 2008/0014770 A1* | 1/2008 | Lai | H05K 1/141 | 439/79 |
| 2008/0026610 A1* | 1/2008 | Frake | B29C 43/18 | 439/76.1 |
| 2008/0057743 A1* | 3/2008 | Sogabe | H01R 43/0235 | 439/65 |
| 2008/0085616 A1* | 4/2008 | Hirai | H05K 3/3426 | 439/83 |
| 2008/0139048 A1* | 6/2008 | Tai | H01R 13/6658 | 439/607.01 |
| 2009/0091897 A1* | 4/2009 | Willing | H02M 7/003 | 361/752 |
| 2009/0208168 A1* | 8/2009 | Ishikawa | H01R 13/113 | 385/14 |
| 2009/0257207 A1* | 10/2009 | Wang | G06F 1/1626 | 361/752 |
| 2009/0273905 A1* | 11/2009 | Park | H01L 23/49816 | 361/737 |
| 2009/0296361 A1* | 12/2009 | Huang | H05K 3/284 | 361/783 |
| 2010/0132981 A1* | 6/2010 | Muro | H05K 1/0236 | 174/250 |
| 2010/0157545 A1* | 6/2010 | Lehtimaki | H05K 1/0218 | 361/728 |
| 2010/0165587 A1* | 7/2010 | Yamada | G06K 19/077 | 361/752 |
| 2010/0177483 A1* | 7/2010 | Yoshimoto | H05K 3/284 | 361/714 |
| 2011/0223806 A1* | 9/2011 | You | H01R 13/6658 | 439/620.22 |
| 2011/0275246 A1* | 11/2011 | Kooiman | H01R 9/038 | 439/620.22 |
| 2012/0008316 A1* | 1/2012 | Ivey | F21V 19/003 | 362/217.13 |
| 2013/0323951 A1* | 12/2013 | Yu | H01R 31/065 | 439/218 |
| 2014/0038474 A1* | 2/2014 | Liskow | H01R 12/778 | 439/867 |
| 2014/0073186 A1 | 3/2014 | Webb | | |
| 2014/0273644 A1* | 9/2014 | McSweyn | H01R 27/00 | 439/628 |
| 2015/0031223 A1* | 1/2015 | Liao | H01R 13/44 | 439/136 |
| 2015/0188265 A1* | 7/2015 | Wang | H01R 13/665 | 439/620.22 |
| 2015/0200502 A1* | 7/2015 | Nishimura | H01R 13/6463 | 439/607.05 |
| 2015/0288110 A1* | 10/2015 | Taniguchi | H01R 13/46 | 439/620.22 |
| 2015/0311656 A1* | 10/2015 | Lai | H01R 31/065 | 439/620.22 |
| 2015/0340783 A1* | 11/2015 | Lee | H01R 12/71 | 439/607.29 |
| 2015/0340786 A1* | 11/2015 | Nishio | H01R 12/714 | 439/630 |
| 2015/0359082 A1* | 12/2015 | Nishimura | H05K 1/025 | 333/238 |
| 2016/0013592 A1* | 1/2016 | Kao | H01R 13/6471 | 439/607.55 |
| 2016/0013595 A1* | 1/2016 | Kao | H01R 13/6591 | 439/607.55 |
| 2016/0020556 A1* | 1/2016 | Soos | H01R 13/641 | 439/489 |
| 2016/0043513 A1* | 2/2016 | Bopp | A61B 18/12 | 439/620.22 |
| 2016/0064868 A1* | 3/2016 | Little | H01R 13/6581 | 439/607.01 |
| 2016/0064873 A1 | 3/2016 | Bucher et al. | | |
| 2016/0118730 A1* | 4/2016 | Leng | H01R 12/57 | 439/83 |
| 2016/0204554 A1* | 7/2016 | Yasuda | H01R 13/6658 | 439/620.22 |

\* cited by examiner

Fig. 3  C - C
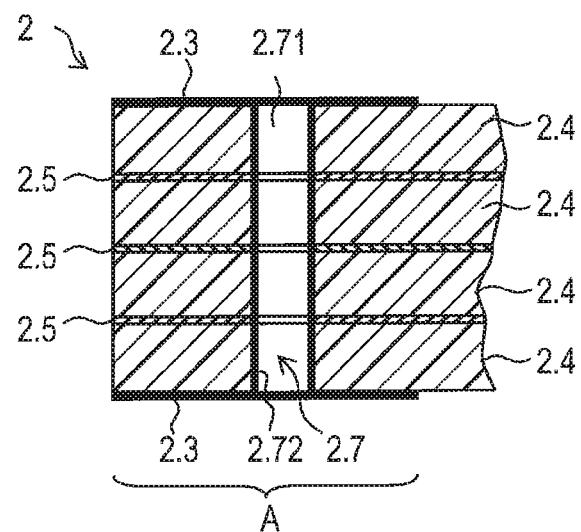
Fig. 4
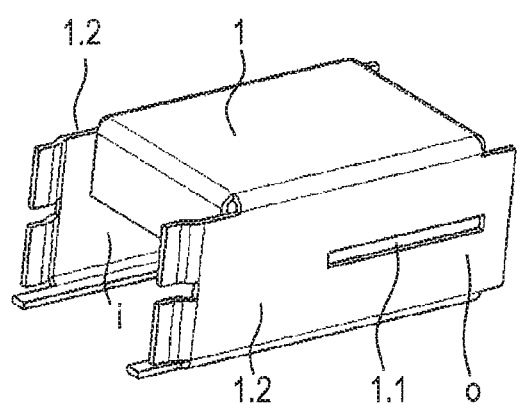

PLUGGABLE ELECTRICAL CONNECTOR

CROSS-REFERENCE TO PRIOR APPLICATION

Priority is claimed to European Patent Application No. EP 16 164 804.3, filed on Apr. 12, 2016, the entire disclosure of which is hereby incorporated by reference herein.

FIELD

The present invention relates to a pluggable electrical connector, which, in particular as part of a cable assembly, is suitable for transmitting electrical currents or voltages.

The pluggable electrical connectors in question can be used in connection with cables in motor vehicles or aircraft, for example, and are frequently required in large quantities. To provide such cables inexpensively, simple construction and ease of assembly of the pluggable electrical connectors are vitally important. Such cables must be manufactured with high process reliability and high precision, such as is required for high-quality signal transmission, for example. In addition, the cables must meet high standards with regard to robustness. Furthermore, it is important that the pluggable connectors not be excessively thermally stressed by the waste heat generated within the pluggable connectors.

BACKGROUND

U.S. Published Application 2016/0064873 A1 describes a pluggable connector having a circuit board disposed within a housing. The heat generated within the housing is conducted to the housing through interleaved plates.

SUMMARY

In an embodiment, the present invention provides a pluggable electrical connector including a thermally conductive housing having an opening and a circuit board having electronic components, at least one plug contact and at least one joining surface. The circuit board is surrounded by the housing. A joining seam connects the housing and the circuit board to each other. The joining seam is located between the at least one joining surface and the housing and is produced on an exterior side of the pluggable connector such that the opening is at least partially closed by the joining seam.

BRIEF DESCIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIG. 3 is a detail sectional view of an edge of the circuit board, taken along line C-C;

FIG. 4 is a perspective view of a housing;

DETAILED DESCRIPTION

Figure 1:
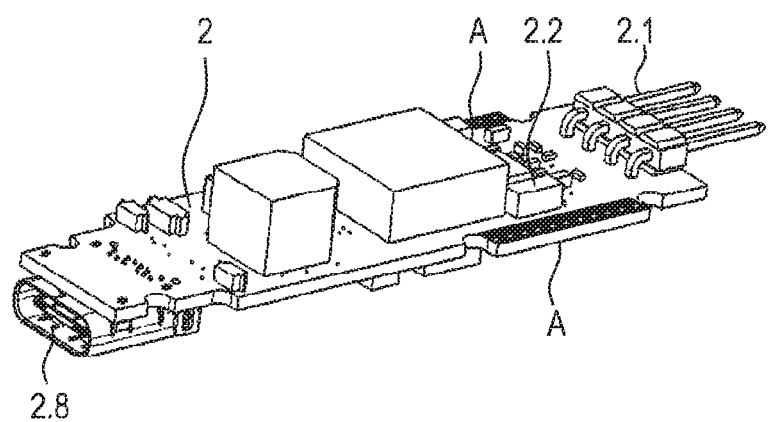
FIG. 1 is a perspective view of a circuit board for a pluggable electrical connector.

In an embodiment, the present invention provides a pluggable electrical connector which is protected from excessive self-heating and yet is relatively simple to manufacture.

In accordance with an embodiment of the present invention, the pluggable electrical connector includes a housing and a circuit board, the housing and the circuit board being connected by a joining seam. The housing is thermally conductive and in particular also electrically conductive and has an opening. The circuit board has electronic components disposed thereon and, in addition, is provided with at least one plug contact. The at least one plug contact may be a pin or contact pin or a contact hole or socket. The circuit board has at least one joining surface, which may in particular be located at an edge of the circuit board. The pluggable connector is configured such that the housing surrounds the circuit board, so that the interior side of the housing faces the electronic components. The joining seam is located between the joining surface and the housing, the joining seam being formed on the exterior side of the pluggable connector; i.e., formed from the exterior side of the pluggable connector. The assembly is configured such that the opening is at least partially closed by the joining seam. The circuit board, or the edge of the circuit board, may extend through the opening, so that the gap between the circuit board and the housing, and thus the opening, is closed by the joining seam.

Accordingly, the joining seam is in direct contact with the joining surface of the circuit board and the housing.

The definition according to which the joining seam is formed on the exterior side of the pluggable connector means in particular that the joining process was performed in such a way that the joining seam was built up from the exterior side of the pluggable connector. The joining seam may be raised with respect to the outer surface of the housing or disposed within the opening and externally accessible. None of the two above-mentioned types of configuration excludes a priori the possibility of forming the joining seam previously on the exterior side of the pluggable connector.

Advantageously, the circuit board has two joining surfaces, and the at least one plug contact is oriented parallel to an axis, the joining surfaces being offset from one another in a direction orthogonal to the axis. With regard to the position of the plug contact, parallelism relative to the axis is to be understood to mean that the pluggable connector is to be operated in this direction during normal operation. Consequently, the pluggable connector can be caused to make or break contact with a mating part by pushing or pulling in a direction parallel to the axis, respectively.

If the circuit board has two joining surfaces, the electronic components are advantageously disposed on the circuit board between the joining surfaces. Accordingly, a geometric connecting line between the joining surfaces would intersect the electronic components.

In an advantageous construction, the joining surfaces and the joining seam form what may be referred to as a joint region, which is disposed in the opening of the housing. The joint region may be completely or only partially disposed in the opening of the housing. Consequently, both the joining surface and the joining seam are at least partially disposed within the opening of the housing.

Advantageously, the opening takes the form of a cutout having a circumferential boundary edge. Accordingly, the cutout may have a closed circumferential boundary edge and may be formed, for example, by punching into a wall of the housing. Alternatively, the opening may also be formed between parts of a multi-part housing.

In particular, if the opening takes the form of a cutout having a circumferential boundary edge, the joining seam may be circumferential in configuration and in particular extend along the contour of the boundary edge.

In a further embodiment of the present invention, the opening has its greatest extent in a direction parallel to the axis, the axis being oriented parallel to the at least one plug contact. In this embodiment, the opening may be referred to as a slot parallel to the axis.

If the opening is formed with a circumferential boundary edge, then the forces that occur during manufacture or when making or breaking contact with a mating part and are introduced into the circuit board via the at least one plug contact and which are oriented parallel to the axis can be passed into the housing via the positive contact.

Advantageously, the housing; i.e., the material from which the housing is made, has a thermal conductivity of at least 10 W/(m·K), in particular a thermal conductivity of at least 25 W/(m·K). In particular, the housing may be made from a metal material.

In an advantageous construction, the joining seam takes the form of a soldered seam, the joining surface constituting a surface of a metallic layer on the circuit board. In particular, the joining surface may be formed as a soldering pad. In another embodiment of the present invention, the joining seam may be produced by a wave soldering process.

Advantageously, the circuit board has at least one metal-plated bore in the region of the joining surface. The metal-plated bore may be produced as a through-connection or via. Thus, the joining surface may take the form of a soldering pad having one or more through-connections. In particular, the circuit board is configured such that the bore extends through the joining surface, so that a hole is present in the joining surface.

If the circuit board has a plurality of metal-plated bores in the region of the joining surface, then the bores are advantageously lined up in a direction parallel to the axis. In this case, therefore, the circuit board may be configured such that the plurality of bores extend through the joining surface.

As an alternative to soldering, a welding process or an adhesive bonding process may also be used as a joining process. Accordingly, the joining seam will then be a weld seam or an adhesive seam. In the case of an adhesive seam, it is advantageous for the adhesive to have a relatively high thermal conductivity and to contain, for example, thermally conductive fillers.

In an advantageous construction, the circuit board is multilayered and has at least one thermally conductive layer. Typically, such a multilayered circuit board has a plurality of insulating layers and one or more thermally conductive layers.

In a further embodiment of the present invention, the circuit board has a joining surface on both its top and underside, the respective joining surfaces being disposed opposite each other.

Advantageously, the circuit board is configured such that the joining surface is disposed thereon with an overhang in a direction orthogonal to the axis. In other words, an overhang having one or more joining surfaces thereon may be located or formed alongside the circuit board.

If the circuit board has a plurality of joining surfaces, then it may be configured such that the features mentioned above with respect to one joining surface apply to the plurality of joining surfaces. Thus, the housing may have a plurality of openings, and the circuit board may have a plurality of joining surfaces, each of which may in particular be located at an edge of the circuit board. Then, the joining seams are each disposed between one of the joining surfaces and the housing, each joining seam being formed on the exterior side of the pluggable connector. Furthermore, the associated opening is then at least partially closed by the respective joining seam.

The pluggable electrical connector enables the heat generated by the electronic components to be effectively dissipated to the exterior. Moreover, the pluggable electrical connector has excellent properties with respect to shielding against electromagnetic interference radiation.

Figure 2:
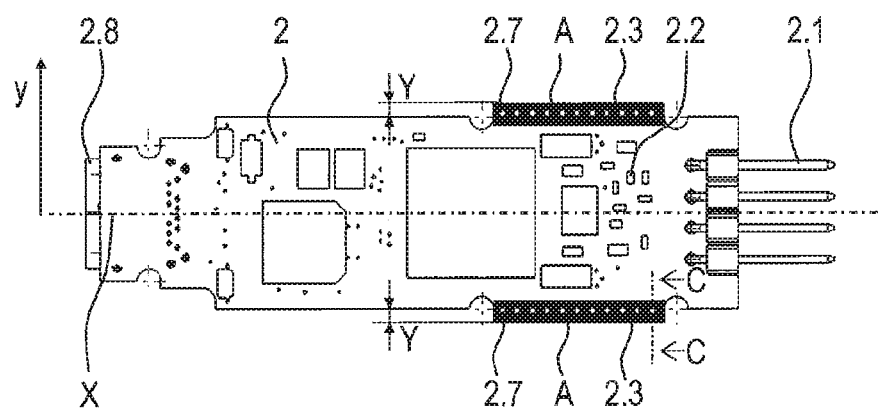
FIG. 2 is a plan view of the circuit board.

The pluggable electrical connector described in the exemplary embodiment presented here includes a circuit board 2 according to FIGS. 1 and 2. In order to electrically connect the pluggable connector to a mating part, plug contacts 2.1, such as, for example, pins are provided on or attached to circuit board 2. Plug contacts 2.1 are oriented parallel to an axis X. Plug contacts 2.1 are electrically connected to a circuit including electronic components 2.2, which are disposed on circuit board 2; i.e., circuit board 2 is populated with electronic components 2.2. Circuit board 2 further includes an input contact 2.8 connectable to leads of a cable.

Circuit board 2 has an edge A on each of its long sides, the respective edges A being disposed on both sides of axis X; i.e., on both sides of electronic components 2.2. Joining surfaces 2.3 are formed on both the top and underside of circuit board 2 at edges A, the respective joining surfaces being disposed opposite each other. In the exemplary embodiment presented here, joining surfaces 2.3 are formed as metallic layers. Thus, joining surfaces 2.3 are offset from each other in a direction y orthogonal to axis X, the electronic components 2.2 being disposed on circuit board 2 between joining surfaces 2.3.

Circuit board 2 is configured such that joining surfaces 2.3 are each disposed thereon with an overhang Y in direction y. In particular, joining surfaces 2.3 are disposed at edges A of circuit board 2 where circuit board 2 has its greatest width. Axis X extends in the longitudinal direction (perpendicular to the direction of the width dimension; i.e., perpendicular to direction y).

Circuit board 2 is formed with bores 2.7, here configured as through-connections, at the respective edges A. In accordance with FIG. 3, bores 2.7 each include a cavity 2.71 whose wall has a metallic layer 2.72. Metal-plated bores 2.7 are lined up along a direction parallel to axis X.

In FIG. 3, an edge A is shown in a cross-sectional view taken along line C-C in FIG. 2. Accordingly, circuit board 2 includes a plurality of insulating layers 2.4, in particular a plurality of prepreg layers, as well as a plurality of thermally conductive layers 2.5, which may be made, for example, of a copper alloy. It is also apparent from FIG. 3 that, in the exemplary embodiment presented here, joining surfaces 2.3 are formed on the topside and on the underside of circuit board 2 in the region of the respective edge A. Alternatively or in addition to this design, a joining surface could be formed on the end face (left in FIG. 3).

The pluggable electrical connector further includes a thermally and electrically conductive housing 1 as shown in FIG. 4. In the exemplary embodiment presented here, this housing is produced in one piece from sheet steel. Housing 1 is formed, in particular by folding, such that its cross section is, in a first approximation, in the form of a U having two legs 1.2. Accordingly, housing 1 has an exterior side o and an interior side i which, upon assembly, is oriented toward circuit board 2. Housing 1 has two openings 1.1, here in the form of cutouts, in particular in the form of slots, so that the respective opening 1.1 has a circumferential boundary edge. In particular, the openings 1.1 are here formed in legs 1.2 of housing 1.

Figure 5:
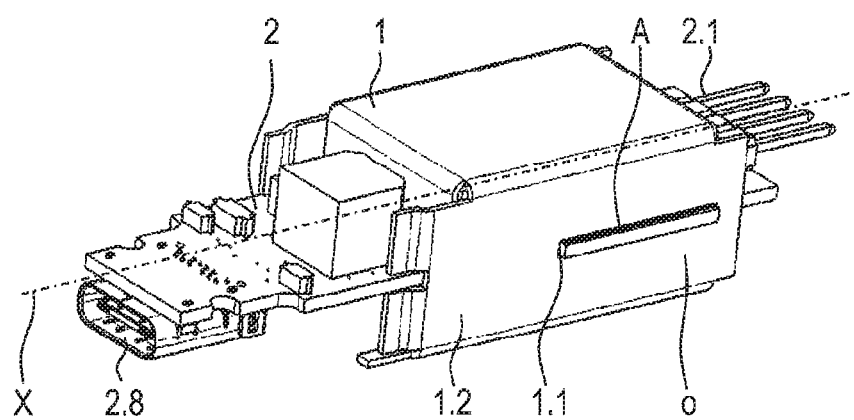
FIG. 5 is a perspective view showing the circuit board in an assembled condition in which the housing surrounds the circuit board.

During the assembly of the pluggable connector, legs 1.2 are slightly bent apart, so that circuit board 2 can be inserted into housing 1. In this process, as shown in FIG. 5, edges A of circuit board 2 are passed into openings 1.1 of housing 1, so that edges A extend through openings 1.1. In this position, bores 2.7 and at least portions of joining surfaces 2.3 are disposed in openings 1.1, so that bores 2.7 are at least partially covered by the wall of housing 1. Openings 1.1 take the form of cutouts extending in the longitudinal direction, so that the cutouts are oriented parallel to axis X and have their greatest extent in this direction parallel to the axis X. Openings 1.1 are disposed on both sides of axis X and furthermore parallel to plug contacts 2.1. Once the legs have returned to their relaxed state, circuit board 2 is fixedly secured in housing 1, which surrounds circuit board 2.

Figure 7:
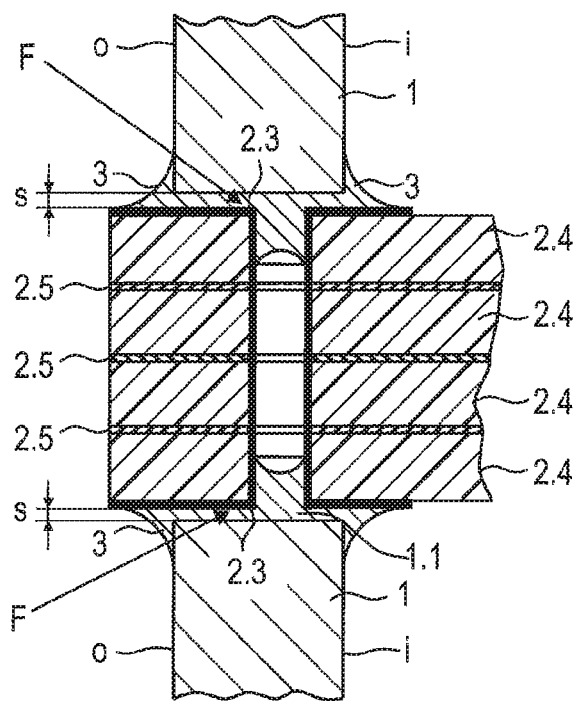
FIG. 7 is a detail sectional view of an edge of the circuit board and the housing, taken along line C-C.

Later in the assembly process, housing 1 and circuit board 2 may be joined; i.e., permanently connected together. The joining of the pluggable connector is performed from exterior side o. In the exemplary embodiment presented here, the joining technique used is a soldering process. In particular, housing 1 and circuit board 2 are joined using a wave soldering technique. For this purpose, housing 1 and circuit board 2 fixedly secured therein according to FIG. 5 are rotated such that legs 1.2 are oriented horizontally. In this position, the assembly is joined in a soldering machine. In this process, edge A of circuit board 2 and an associated leg 1.2 of housing 2 are passed over a solder wave. As a result, as shown in FIG. 7, a joining seam 3 is formed, which may here be referred to as a soldered seam. As a result of the wetting properties present during the soldering process, joining seam 3 extends over the entire joining surface 2.3.

Joining seam 3 is thus produced on exterior side o of the pluggable connector, a gap s between circuit board 2, respectively joining surfaces 2.3, and the wall of housing 1 in the region of opening 1.1. being closed by joining seam 3, so that ultimately opening 1.1 is closed by joining seam 3. In addition, joining seam 3 at least partially fills bores 2.7 or cavities 2.71. Furthermore, joining seam 3 is in contact with housing 1 and, in particular, is configured to extend circumferentially along the boundary edge in opening 1.1. Joining surface 2.3 and joining seam 3 form a joint region F. Joint region F is partially disposed in opening 1.1 of housing 1; i.e., joining surfaces 2.3 and joining seam 3 are each partially disposed in opening 1.1 of housing 1.

Once one of edges A of circuit board 2 (i.e., a pair of joining surfaces 2.3) is connected to housing 1, circuit board 2, together with housing 1, is rotated 180°, so that the second surface to be joined comes to rest in a lower position and is joined in the same manner as the first joint.

Figure 6:
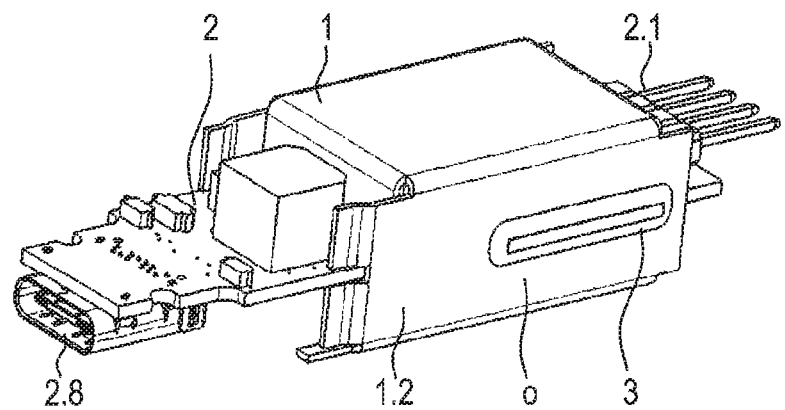
FIG. 6 is a perspective view of the circuit board, showing the housing after joining.

A corresponding pluggable connector is shown in FIG. 6, in which joint 3 can be seen on exterior side o of housing 1.

Figure 8:
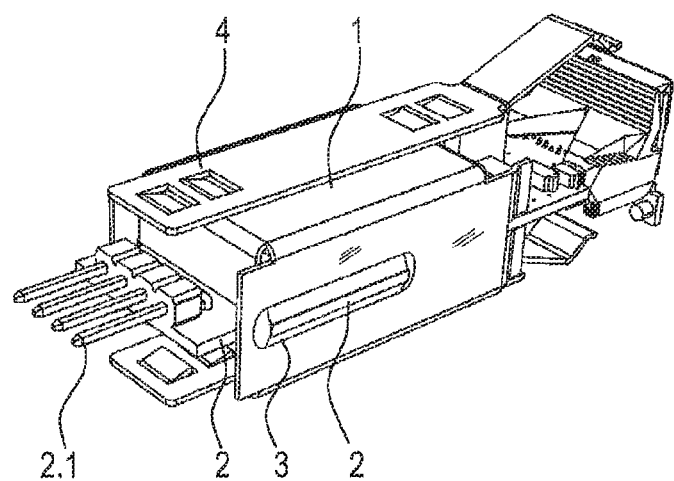
FIG. 8 is a perspective view of the pluggable electrical connector.

An electrically insulating outer housing 4 may be mounted around the pluggable electrical connector, resulting in an assembly as shown in FIG. 8.

In the exemplary embodiment presented here, edges A of circuit board 2 extend through opening 1.1. Alternatively the circuit board may be disposed in opening 1.1 of housing 1 such that it is flush therewith or at least not extending therebeyond. In these alternative embodiments, it also advantageous to produce joining seam 3 on exterior side o of the pluggable connector, so that opening 1.1; i.e., a gap s between housing 1 and circuit board 2, is at least partially closed by joining seam 3.

The pluggable electrical connector is intended to be connected to an electrical cable, so that a cable assembly is produced. Such cables are typically used for transmitting electric power and/or signals. The cable is in particular intended for installation in a vehicle and, in the exemplary embodiment, has no shield. The pluggable connector allows one end of the cable to be detachably connected to a mating part of another component, such as, for example, an element of an on-board electronic system, in the manner of a plug-type connection.

During operation of the cable, electronic components 2.2 generate waste heat, part of which can flow away through thermally conductive layers 2.5 of multilayered circuit board 2 toward edges A. In particular, if the cable has no shield, as in the exemplary embodiment presented here, the generated heat cannot be conducted away through the shield. With the present design, the waste heat is conducted via metallic layers 2.72 of bores 2.7 and via joining surfaces 2.3 to joining seam 3, and ultimately to housing 1. Housing 1 can effectively dissipate the generated waste heat to the environment, on the one hand because of its large surface area, and on the other hand because of its relatively high thermal conductivity. This makes it possible to prevent excessive thermal stress on circuit board 2.

Finally, with the pluggable connector according to the present invention, excellent EMC shielding is achieved, so that the pluggable connector hardly emits any electromagnetic interference radiation and is insensitive to external electromagnetic radiation.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A pluggable electrical connector, comprising:
   a thermally conductive housing having an opening;
   a circuit board having electronic components, at least one plug contact and at least one joining surface, the circuit board being surrounded by the housing; and
   a joining seam connecting the housing and the circuit board to each other, the joining seam being located between the at least one joining surface and the housing and being produced on an exterior side of the pluggable connector such that the opening is at least partially closed by the joining seam.

2. The pluggable electrical connector as recited in claim 1, wherein the at least one plug contact is oriented parallel to an axis, and wherein the circuit board has two joining surfaces which are offset from one another in a direction orthogonal to the axis.

3. The pluggable electrical connector as recited in claim 1, wherein the circuit board has two joining surfaces, and wherein the electronic components are disposed on the circuit board between the joining surfaces.

4. The pluggable electrical connector as recited in claim 1, wherein the at least one joining surface and the joining seam form a joint region, and wherein the joint region is disposed in the opening of the housing.

5. The pluggable electrical connector as recited in claim 1, wherein the opening is in a form of a cutout having a circumferential boundary edge.

6. The pluggable electrical connector as recited in claim 1, wherein the at least one joining seam is circumferential in configuration.

7. The pluggable electrical connector as recited in claim 1, wherein the at least one plug contact is oriented parallel to an axis, and wherein the opening has its largest dimension in a direction parallel to the axis.

8. The pluggable electrical connector as recited in claim 1, wherein the housing is made of a metal-containing material.

9. The pluggable electrical connector as recited in claim 1, wherein the joining seam is in a form of a soldered seam, and wherein the at least one joining surface constitutes a surface of a metallic layer on the circuit board.

10. The pluggable electrical connector as recited in claim 9, wherein the joining seam is produced by a wave soldering process.

11. The pluggable electrical connector as recited in claim 1, wherein the circuit board has at least one metal-plated bore in a region of the at least one joining surface.

12. The pluggable electrical connector as recited in claim 1, wherein the at least one plug contact is oriented parallel to an axis, and wherein the circuit board has a plurality of metal-plated bores in a region of the at least one joining surface, the bores being lined up in a direction parallel to the axis.

13. The pluggable electrical connector as recited in claim 1, wherein the circuit board is multilayered and has at least one thermally conductive layer.

14. The pluggable electrical connector as recited in claim 1, wherein the circuit board has a joining surface on both a top and an underside thereof.

15. The pluggable electrical connector as recited in claim 1, wherein the at least one plug contact is oriented parallel to an axis, and wherein the circuit board is configured such that the at least one joining surface is disposed thereon with an overhang in a direction orthogonal to the axis.

* * * * *